United States Patent
Hosoda et al.

(10) Patent No.: US 6,870,171 B2
(45) Date of Patent: Mar. 22, 2005

(54) EXPOSURE APPARATUS

(75) Inventors: Masaki Hosoda, Kanagawa (JP); Masato Muraki, Tokyo (JP); Hiroya Ohta, Kodaira (JP); Haruo Yoda, Hinode (JP)

(73) Assignees: Canon Kabushiki Kaisha, Tokyo (JP); Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 10/806,190

(22) Filed: Mar. 23, 2004

(65) Prior Publication Data

US 2004/0188636 A1 Sep. 30, 2004

(30) Foreign Application Priority Data

Mar. 28, 2003 (JP) .......................... 2003-092114

(51) Int. Cl.[7] .................. H01J 37/302; H01J 37/04; H01J 37/30
(52) U.S. Cl. .................. 250/492.22; 250/491.1; 250/492.2; 250/492.24; 250/492.3; 250/492.1; 250/397; 250/398; 250/396 ML; 250/396 R; 430/296
(58) Field of Search .............. 250/492.22, 491.1–492.3, 250/397–398, 396 ML, 396 R; 430/296

(56) References Cited

U.S. PATENT DOCUMENTS

| | | | |
|---|---|---|---|
| 5,834,783 A | 11/1998 | Muraki et al. ............... 250/398 |
| 5,864,142 A | 1/1999 | Muraki et al. ............ 250/491.1 |
| 5,905,267 A | 5/1999 | Muraki .................... 250/492.22 |
| 5,929,454 A | 7/1999 | Muraki et al. ............ 250/491.1 |
| 5,939,725 A | 8/1999 | Muraki .................... 250/492.22 |
| 5,973,332 A | 10/1999 | Muraki et al. ........... 250/492.2 |
| 5,981,954 A | 11/1999 | Muraki ....................... 250/397 |
| 6,054,713 A | 4/2000 | Miyake et al. .......... 250/492.24 |
| 6,104,035 A | 8/2000 | Muraki .................... 250/492.22 |
| 6,107,636 A * | 8/2000 | Muraki ..................... 250/492.2 |
| 6,124,599 A | 9/2000 | Muraki .................... 250/492.22 |
| 6,137,113 A | 10/2000 | Muraki .................... 250/492.22 |
| 6,166,387 A | 12/2000 | Muraki et al. ............ 250/492.2 |
| 6,323,499 B1 | 11/2001 | Muraki et al. .......... 250/492.22 |
| 6,392,243 B1 | 5/2002 | Muraki ...................... 250/491.1 |
| 6,472,672 B1 * | 10/2002 | Muraki ..................... 250/492.2 |
| 6,552,353 B1 * | 4/2003 | Muraki ..................... 250/492.2 |
| 6,559,456 B1 | 5/2003 | Muraki ...................... 250/491.1 |
| 6,559,463 B2 | 5/2003 | Ono et al. .............. 250/492.22 |
| 6,566,664 B2 | 5/2003 | Muraki ..................... 250/492.2 |
| 6,583,430 B1 | 6/2003 | Muraki .................... 250/492.22 |
| 6,657,210 B1 | 12/2003 | Muraki .................... 250/492.22 |
| 6,777,697 B2 * | 8/2004 | Yui et al. ................ 250/492.22 |
| 2002/0160311 A1 | 10/2002 | Muraki et al. .............. 430/296 |
| 2002/0179855 A1 | 12/2002 | Muraki .................... 250/492.22 |
| 2004/0188636 A1 * | 9/2004 | Hosoda et al. .......... 250/492.22 |

FOREIGN PATENT DOCUMENTS

JP          9-245708          9/1997

* cited by examiner

*Primary Examiner*—John R. Lee
*Assistant Examiner*—Bernard E. Souw
(74) *Attorney, Agent, or Firm*—Fitzpatrick, Cella, Harper & Scinto

(57) ABSTRACT

An electron beam exposure apparatus which exposes a wafer (118) by using a plurality of electron beams corrects the positional error of the electron beams by using multi-deflector arrays (105, 106) capable of independently deflecting the positions of the electron beams, and pattern data to be projected onto the wafer (118). More specifically, when each of the electron beams is deflected to a predetermined exposure position on the basis of the pattern data, a static positional error independent of the deflection position is corrected by the multi-deflector arrays (105, 106), and a dynamic positional error depending on the deflection position is corrected on the basis of the pattern data.

8 Claims, 9 Drawing Sheets

EXPOSURE APPARATUS

FIELD OF THE INVENTION

The present invention relates to a charged-particle beam exposure technique of exposing a target object such as a wafer serving as the material of a semiconductor integrated circuit or the like by using an electron beam or ion beam and, more particularly, to a multibeam charged-particle beam exposure technique of drawing a pattern by using a plurality of electron beams and a device manufacturing technique using this exposure technique.

BACKGROUND OF THE INVENTION

Roughly two methods have recently been studied and developed as a means for increasing the electron beam drawing throughput. The first method is to form a pattern by reduction and projection of an electron beam using a stencil mask. This method can realize high throughput, but formation of a mask is difficult at high cost. The second method is to perform drawing at once simultaneously using a point beam and variable rectangular beam as a conventional electron beam drawing method.

A method using a plurality of electron optical systems by assigning one electron beam to one electron optical system comprised of an electron lens and deflector is defined as a multicolumn method. A method of causing one electron optical system to transmit a plurality of electron beams is defined as a multibeam method.

As a multibeam type charged-particle beam drawing method, an electron beam emitted by one electron source is split into a plurality of electron beams by an aperture array to perform drawing (Japanese Patent Laid-Open No. 9-245708). This method can correct the beam interval between electron beams to a designed position by using a multi-deflector array for the positional error of each electron beam caused by a plurality of lenses or deflectors.

According to this multibeam drawing method, the positions of a plurality of electron beams may not be adjusted to designed target values due to the manufacturing errors of the electron lens and projection optical system, oblique incidence of an electron beam to the optical axis, a change in electron beam over time, and the like. The multi-deflector array has many wiring lines and requires a high-precision, high-speed analog driving circuit. It is difficult to control the multi-deflector array at high speed.

SUMMARY OF THE INVENTION

The present invention has been made to overcome the conventional drawbacks, and has as its object to provide a technique capable of easily correcting the optical characteristics of an exposure beam at high precision and manufacturing a high-precision device by using this technique for the manufacture of a device.

To solve the above problems and achieve the above object, the aspects of the present invention will be enumerated.

[First Aspect]

A multibeam exposure apparatus which exposes a substrate by using a plurality of charged-particle beams comprises a deflection member which deflects an incident position of each of the plurality of charged-particle beams on the substrate, a generation member which generates pattern data to be projected onto the substrate, and a correction member which corrects a positional error of each of the plurality of charged-particle beams by the deflection member and the generation member.

[Second Aspect]

In the first aspect, when each of the plurality of charged-particle beams is deflected to a predetermined exposure position on the basis of the pattern data, the correction member corrects a static positional error independent of a deflection position by the deflection member, and corrects a dynamic positional error dependent on the deflection position by the generation member.

[Third Aspect]

The exposure apparatus defined in the first or second aspect is used to manufacture a device.

[Fourth Aspect]

A multibeam exposure method of exposing a substrate by deflecting each of a plurality of charged-particle beams to a predetermined exposure position comprises a first correction step of correcting a positional error of each of the plurality of charged-particle beams by independently deflecting a position of each of the plurality of charged-particle beams, and a second correction step of correcting the positional error of each of the plurality of charged-particle beams by generating pattern data to be projected onto the substrate.

[Fifth Aspect]

In the fourth aspect, in the first correction step, a static positional error independent of a deflection position is corrected when each of the plurality of charged-particle beams is deflected to a predetermined exposure position on the basis of the pattern data, and in the second correction step, a dynamic positional error depending on the deflection position is corrected.

[Sixth Aspect]

An exposure apparatus which exposes a substrate by using a plurality of charged-particle beams on the basis of pattern data, comprises a deflector array which deflects an incident position of each of the plurality of charged-particle beams on the substrate so as to correct a first component out of the positional error of each of the plurality of charged-particle beams and a controller which generates the pattern data so as to correct a second component out of the positional error of each of the plurality of charged-particle beams.

[Seventh Aspect]

In the sixth aspect, the apparatus further comprises a main deflector which deflects the plurality of charged-particle beams at once, wherein the first component contains a static distortion independent of deflection by the main deflector, and the second component contains a dynamic distortion dependent on the deflection by the main deflector.

[Eighth Aspect]

A device manufacturing method comprises steps of exposing a substrate by using an exposure apparatus defined in the sixth aspect and developing the exposed substrate.

As described above, the present invention can provide a multibeam exposure apparatus capable of easily correcting the optical characteristics of an exposure beam at high precision. When a device is manufactured using this exposure apparatus, a higher-precision device than a conventional one can be manufactured.

Other objects and advantages besides those discussed above shall be apparent to those skilled in the art from the description of a preferred embodiment of the invention, which follows. In the description, reference is made to accompanying drawings, which form a part thereof, and which illustrate an example of the invention. Such example, however, is not exhaustive of the various embodiments of the invention, and therefore reference is made to the claims, which follow the description for determining the scope of the invention.

DETAILED DESCRIPTION OF THE PREFERRED EMBODIMENTS

Preferred embodiments of the present invention will be described in detail below with reference to the accompanying drawings.

The following embodiment will exemplify an exposure apparatus using an electron beam as an example of a charged-particle beam. However, the present invention is not limited to the electron beam and can also be applied to an exposure apparatus using an ion beam.

[Description of Building Components of Electron Beam Exposure Apparatus]

Figure 1:
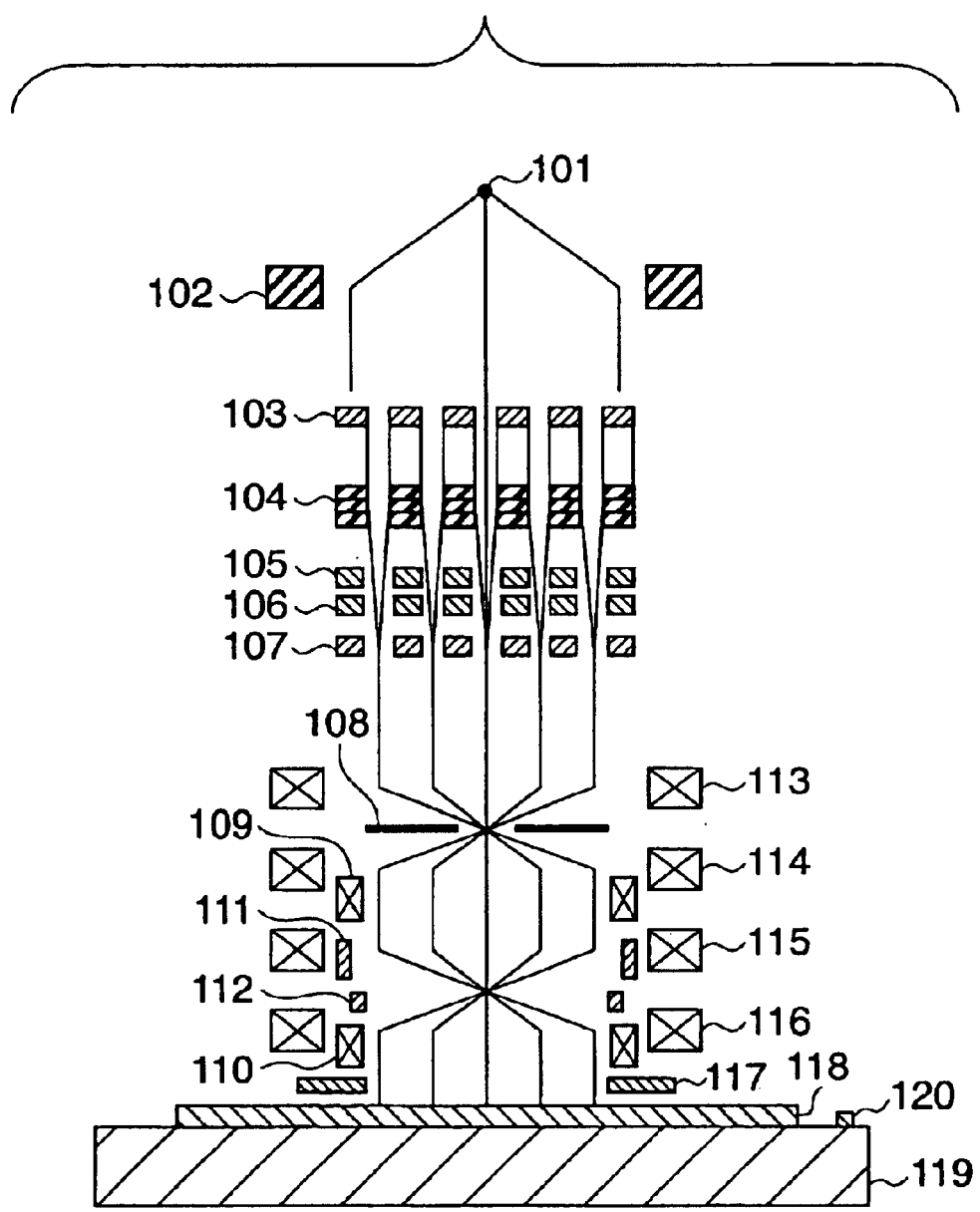
FIG. 1 is a schematic view showing the main part of an electron beam exposure apparatus according to an embodiment of the present invention.

FIG. 1 is a schematic view showing main part of a multibeam type electron beam exposure apparatus according to the present invention. The electron beam exposure apparatus according to an embodiment and its function of adjusting the optical characteristics of an exposure beam will be explained with reference to FIG. 1.

Reference numerals 101 to 107 denote multi-source modules which form a plurality of electron source images and emit electron beams from the electron source images. In FIG. 1, the multi-source modules are two-dimensionally arrayed in a 5×5 matrix.

The multi-source module 101 is an electron source (crossover image) formed by an electron gun. An electron beam emitted by the electron source 101 is collimated into an almost parallel electron beam by the condenser lens 102.

The multi-source module 103 is an aperture array formed by two-dimensionally arraying apertures. The multi-source module 104 is a lens array formed by two-dimensionally arraying electrostatic lenses. The multi-source modules 105 and 106 are multi-deflector arrays each formed by two-dimensionally arraying electrostatic octupole deflectors which can be so driven as to independently deflect the incident position (position within a plane perpendicular to the optical axis) of each electron beam on the substrate. The multi-source module 107 is a blanker array formed by two-dimensionally arraying electrostatic blankers which can be so driven as to independently deflect the position and exit direction of each electron beam.

Figure 2:
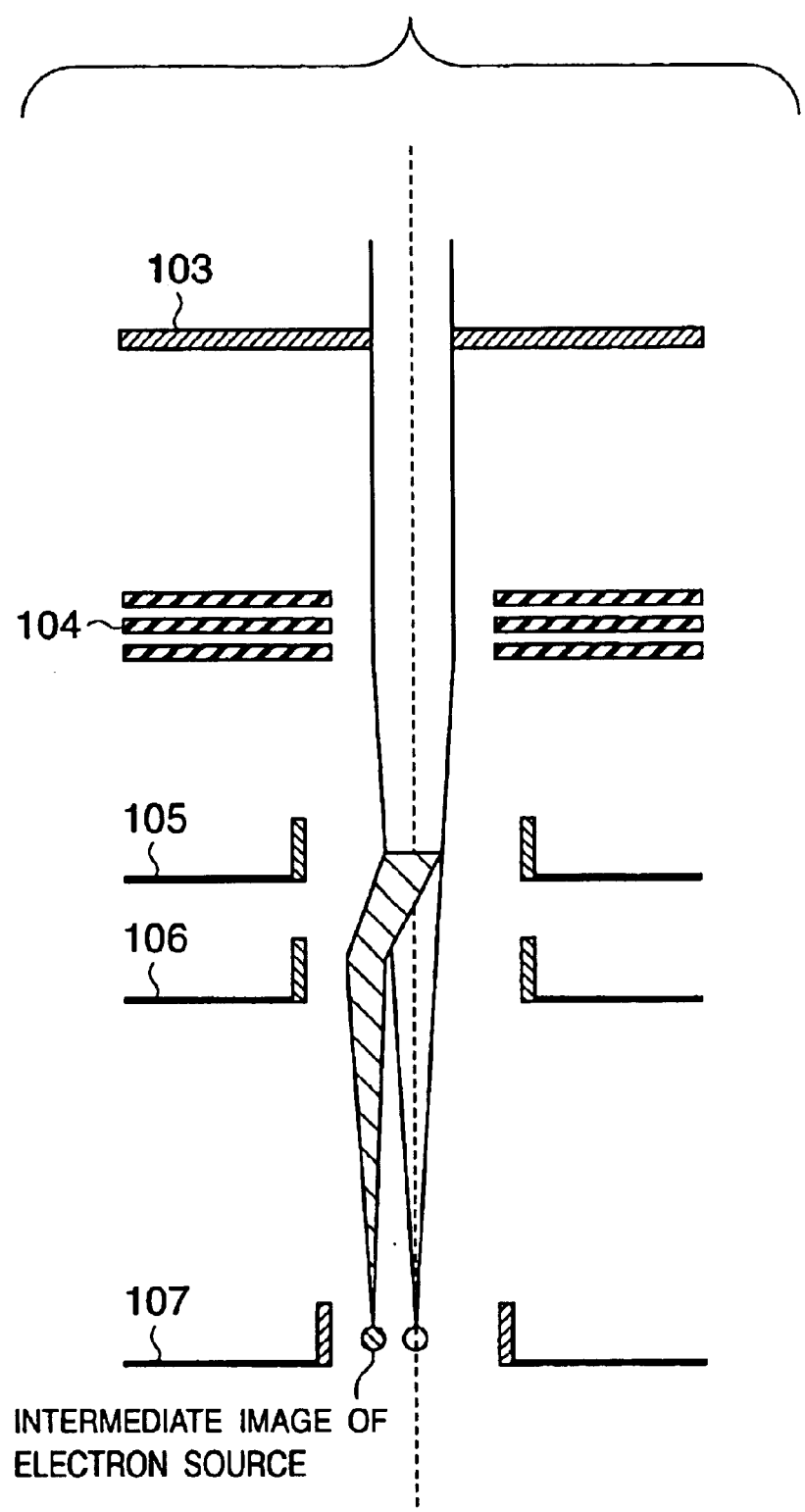
FIG. 2 is a view for explaining the function of a multi-source module.

The functions of these components will be explained with reference to FIG. 2.

An almost parallel electron beam from the condenser lens 102 is split into a plurality of electron beams by the aperture array 103. Each split electron beam forms the intermediate image of the electron source via a corresponding electrostatic lens of the lens array 104 at a position where a corresponding blanker of the blanker array 107 is arranged.

At this time, the multi-deflector arrays 105 and 106 individually adjust the position (position within a plane perpendicular to the optical axis) of the intermediate image of the electron source that is formed on the blanker array 107. An electron beam deflected by the blanker array 107 is cut off by a blanking aperture 108 in FIG. 1, and is not incident on a wafer 118. An electron beam not deflected by the blanker array 107 is not cut off by the blanking aperture 108 in FIG. 1, and is incident on the wafer 118.

Referring back to FIG. 1, a plurality of intermediate images of the electron source that are formed by the multi-source modules are projected onto the wafer 118 via the reduction projection system of magnetic lenses 113 to 116.

When a plurality of intermediate images are projected onto the wafer 118, their focus positions can be adjusted by dynamic focus lenses (electrostatic or magnetic lenses) 109 and 110.

Reference numerals 111 and 112 denote a main deflector and sub-deflector which deflect each electron beam to an exposure position.

Reference numeral 117 denotes a reflected-electron detector for measuring the position of each intermediate image of the electron source that is formed on the wafer 118.

Reference numeral 119 denotes a stage for moving a wafer.

Reference numeral 120 denotes a mark (reference mark) for detecting the position of an electron beam.

Figure 3:
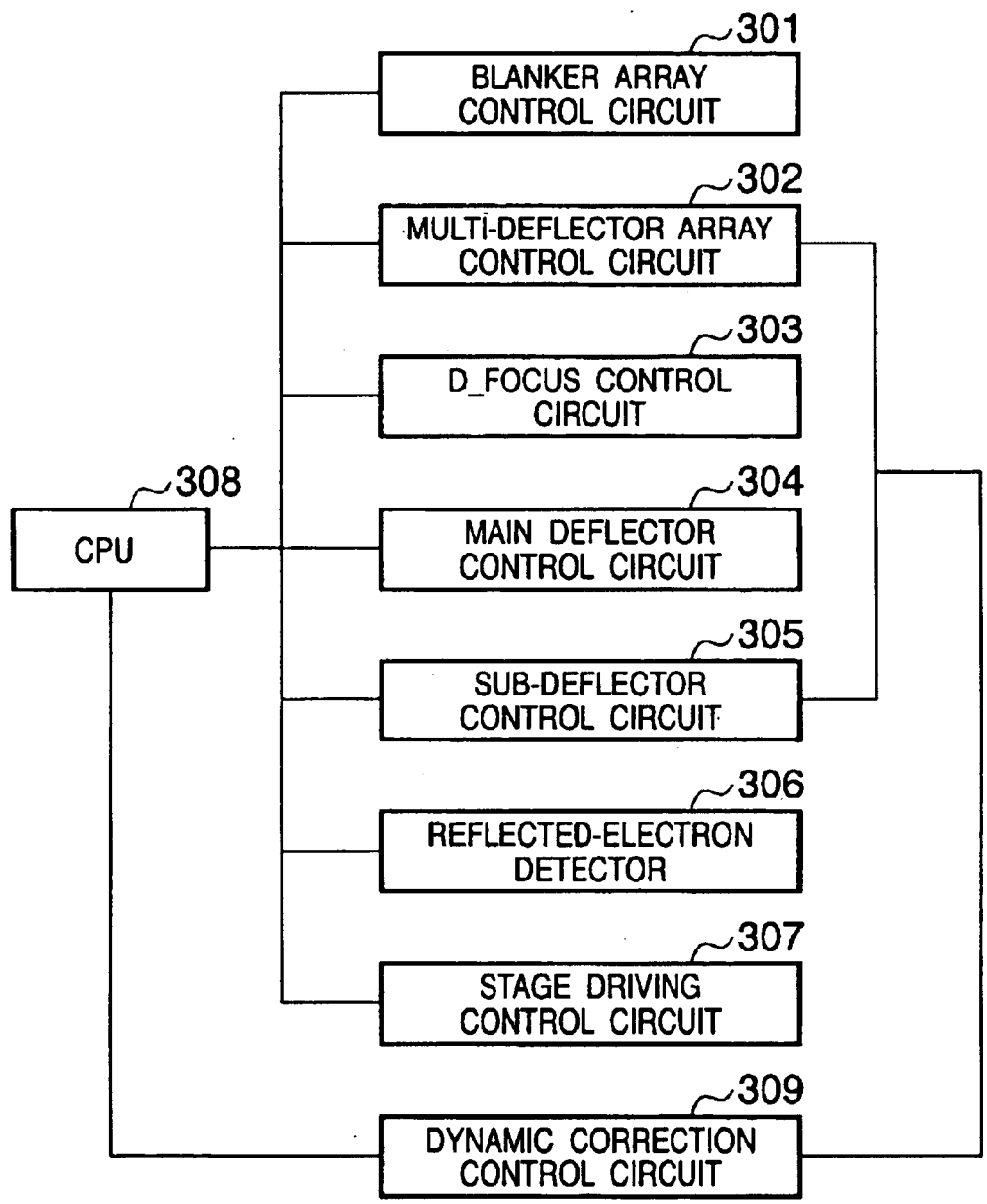
FIG. 3 is a block diagram for explaining a system configuration according to the embodiment.

FIG. 3 shows a system configuration according to the embodiment.

A blanker array control circuit 301 individually controls a plurality of blankers which form the blanker array 107. A multi-deflector array control circuit 302 individually controls the multi-deflector arrays 105 and 106. A D_FOCUS control circuit 303 individually controls the dynamic focus lenses 109 and 110. A main deflector control circuit 304 controls the main deflector 111. A sub-deflector control circuit 305 controls the sub-deflector 112. A reflected-electron detection circuit 306 processes a signal from the reflected-electron detector 117.

A stage driving control circuit 307 drives and controls the stage 119 in cooperation with a laser interferometer (not shown) which detects the stage position. A CPU 308 controls these control circuits and manages the whole electron beam exposure apparatus.

A dynamic correction control circuit 309 performs dynamic correction using the multi-deflector array control circuit 302 and sub-deflector control circuit 305. Details of the dynamic correction control circuit 309 will be described later.

[Description of Method of Correcting Positional Error of Electron Beam]

Figure 4:
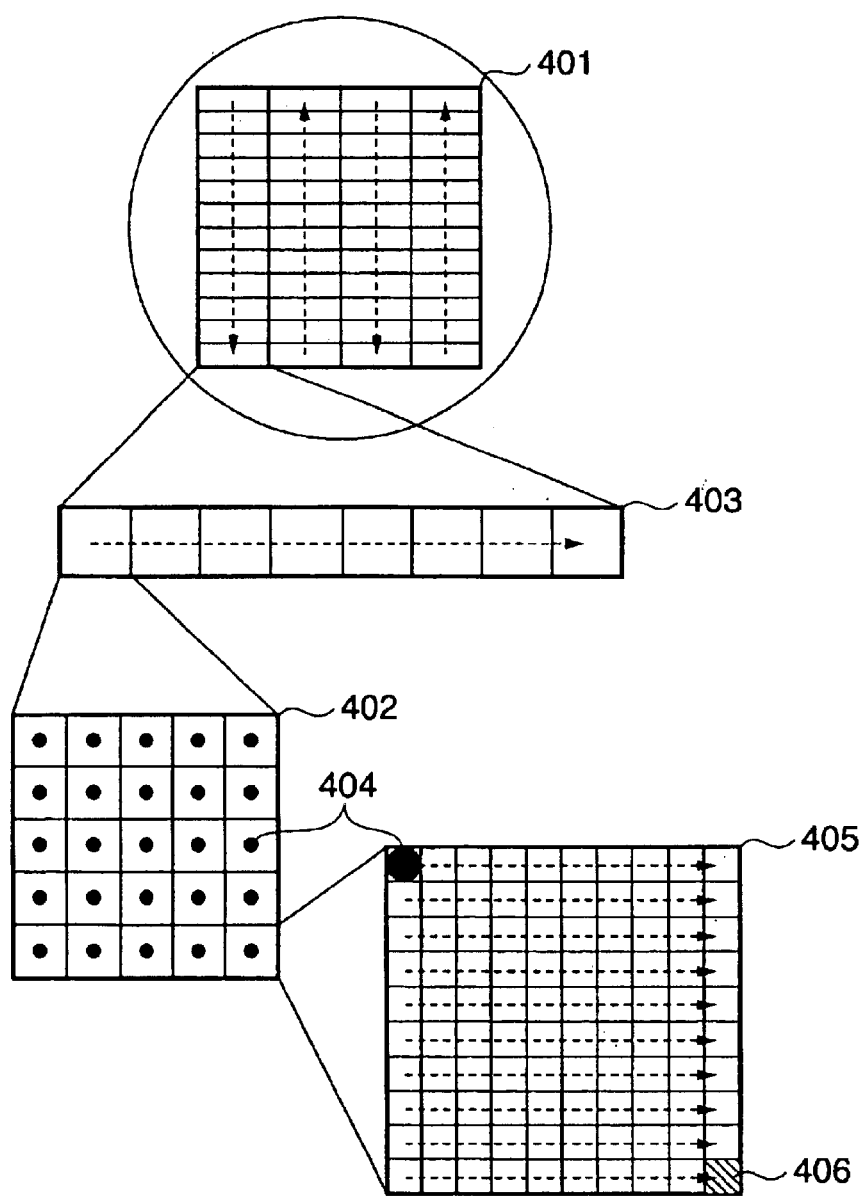
FIG. 4 is a view showing drawing operation in the electron beam exposure apparatus according to the embodiment.

Drawing operation in the electron beam exposure apparatus according to the embodiment will be described with reference to FIG. 4.

A pattern to be drawn on the wafer is divided into stripes 401 each having a width deflectable by the main deflector 111. Each stripe 401 is divided into main deflection regions 403 each of which is divided into sub-deflection regions 402 each corresponding to the size of an array of electron beams. A plurality of electron beams on the wafer within the sub-deflection region 402 are simultaneously deflected by the sub-deflector 112 to draw a pattern in the entire sub-deflection region 402. A region subjected to drawing by one electron beam 404 in the sub-deflection region 402 is defined as a micro deflection region 405. The electron beam 404 is so deflected as to raster-scan the micro deflection region 405 sequentially from the corner for each pixel 406 which is almost as large in size as the diameter of the electron beam 404. All electron beams in the sub-deflection region 402 are simultaneously deflected by the sub-deflector 112. A pattern is drawn in the sub-deflection region by turning on/off the blanker array 107 in synchronism with deflection of each electron beam in each pixel.

Upon the completion of drawing in one sub-deflection region, an electron beam is deflected by the sub-deflection region by the main deflector 111. Drawing is done in the next sub-deflection region in the same manner, and after drawing is performed in the entire deflection range of the main deflector 111, the processing shifts to drawing in the next main deflection region. At this time, the wafer stage is successively moved.

A method of correcting a positional error in the electron beam exposure apparatus according to the embodiment will be explained with reference to FIGS. 5A to 5F.

Figure 5A:
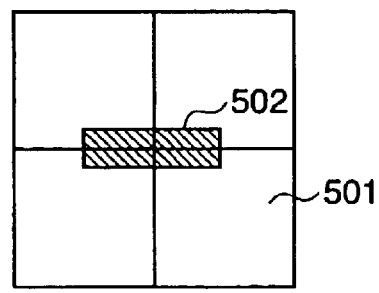
FIGS. 5A to 5F are views for explaining a positional error correction method in the electron beam exposure apparatus according to the embodiment.

FIGS. 5A to 5F exemplify four micro deflection regions extracted from the sub-deflection region. FIG. 5A shows a micro deflection region 501 and a pattern 502 to be drawn.

In the electron beam exposure apparatus according to the embodiment, the position of each electron beam slightly shifts from a target position due to nonuniformity of the aperture shape of each lens array, an unmatched lens interval, the manufacturing error of the reduction projection system, a change over time, and the like.

Figure 5B:
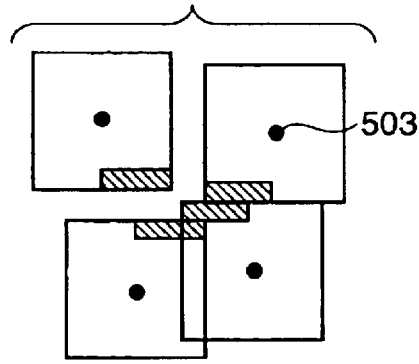
Figure 5C:
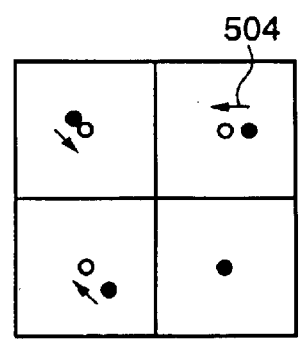

For example, when the intervals between four electron beams 503 vary, as shown in FIG. 5B, the drawing pattern shifts. To solve this problem, a plurality of electron beams are independently deflected using the multi-deflector arrays 105 and 106. The incident position of each electron beam on the wafer can be adjusted, and positional error correction 504 can be executed to draw an accurate drawing pattern. This method is defined as correction using the multi-deflector array.

Figure 5D:
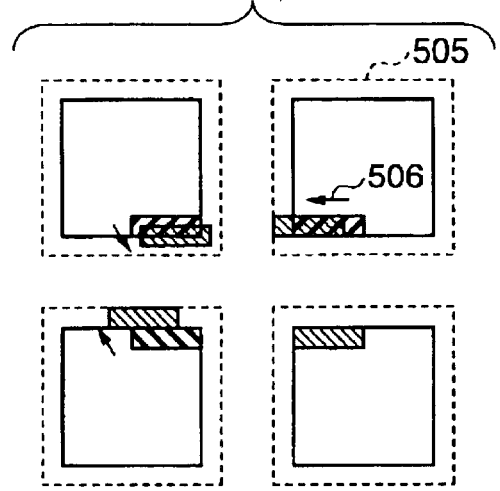
Figure 5E:
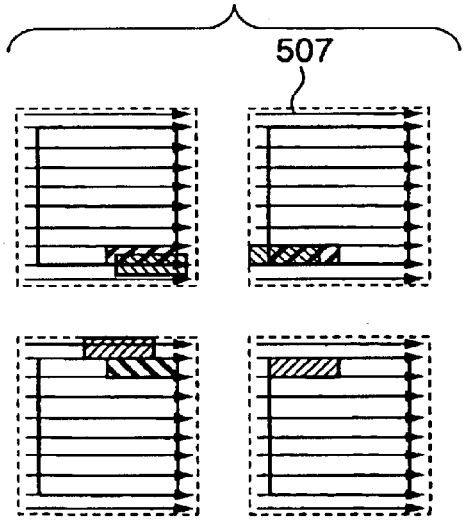
Figure 5F:
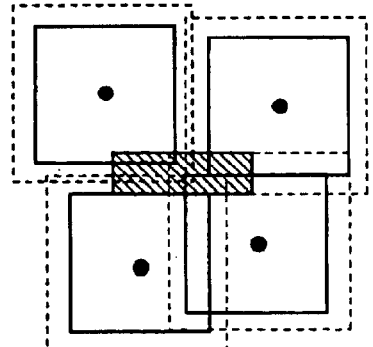
Figure 6A:
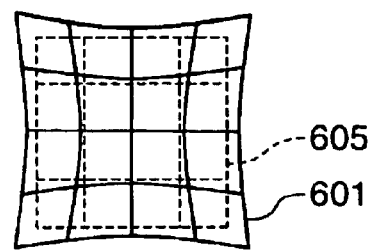
FIGS. 6A to 6D are views for explaining selective use of positional error correction methods in the electron beam exposure apparatus according to the embodiment.
Figure 6B:
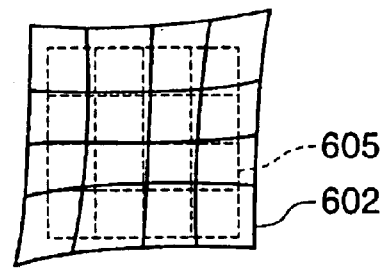
Figure 6C:
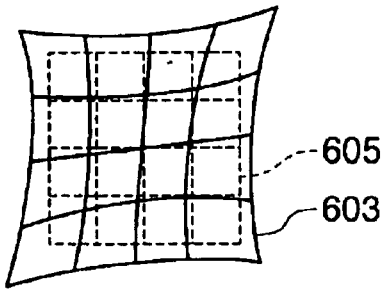
Figure 6D:
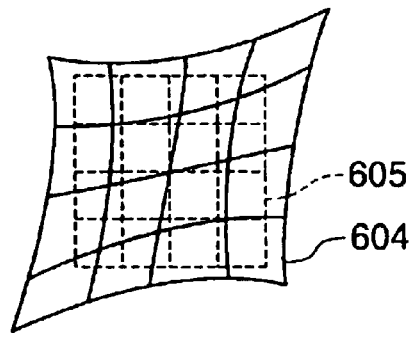

To solve the above problem, a deflection region margin 505 may be imparted around each micro deflection region, and shifting 506 of a pattern to be drawn may be done in a direction in which the positional error of each electron beam is canceled, as shown in FIG. 5D. When electron beam deflection 507 is performed by the sub-deflector 112 in a region including the deflection region margin and the pattern is drawn in the micro deflection region, as shown in FIG. 5E, an accurate drawing pattern can be drawn even with a positional error of each electron beam from a target position, as shown in FIG. 5F. A method of adding a correction amount to pattern data is defined as positional error correction using pattern data.

Selective use of the two correction methods will be described with reference to FIGS. 6A to 6D.

A sub-deflection region shape 601 in a state in which the main deflector 111 is not driven is measured from the moving amount of the stage 119 and an electron beam position obtained from the reflected-electron detector 117. The measured sub-deflection region shape and a target sub-deflection region shape 605 are compared with each other. The difference amount (difference amount independent of deflection by the main deflector 111) is defined as a static distortion (static positional error). The static distortion is corrected by the correction method using the multi-deflector array.

Sub-deflection region shapes 602 to 604 at deflection positions upon moving the main deflector 111 dynamically change in accordance with the deflection amount by the main deflector 111. A sub-deflection region shape measured at each deflection position and the target sub-deflection region shape 605 are compared with each other. The difference amount between the difference amount obtained by the comparison and the static distortion is defined as a dynamic distortion (dynamic positional error) depending on the deflection position. The dynamic distortion is corrected by the positional error correction method using pattern data.

The reason why the static distortion is corrected by the multi-deflector array and the dynamic distortion is corrected by pattern data will be described.

To correct the dynamic distortion by the multi-deflector array, each electron beam must be dynamically deflected in accordance with the deflection amount of the main deflector 111, complicating the control system of the multi-deflector array. When static correction is performed by the multi-deflector array, the distortion amount is constant regardless of the deflection position, and the correction amount is constant once it is determined.

In drawing by raster scanning, the deflection region must be widened in accordance with the correction amount in correction using pattern data, as described above. An excessively large deflection region prolongs the data conversion time and increases the deflection amount, decreasing the throughput.

For this reason, when the static distortion is corrected by the multi-deflector array and the dynamic distortion is corrected on the basis of pattern data, only a necessary correction amount can be added to the pattern data to increase the throughput.

Figure 7:
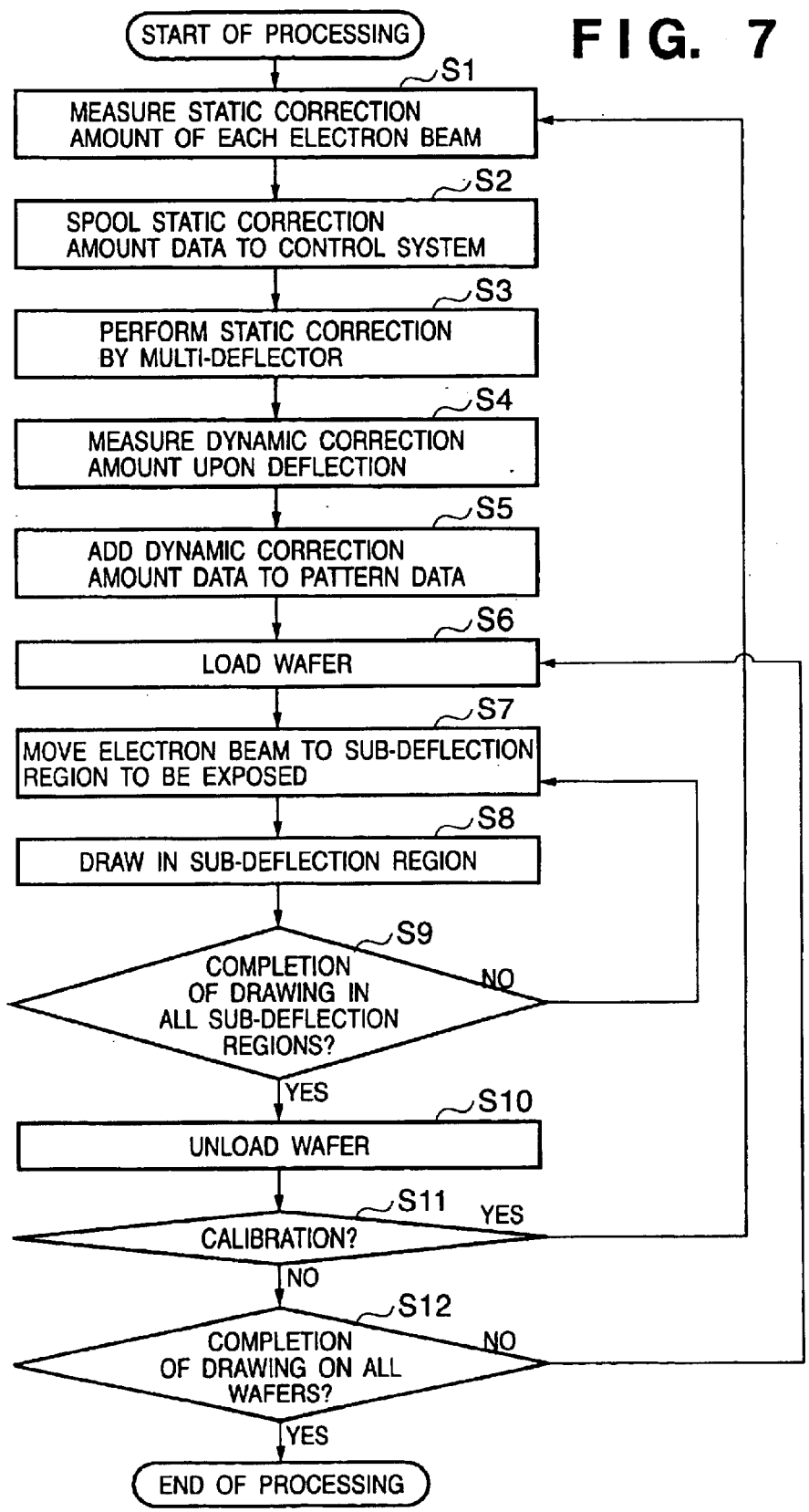
FIG. 7 is a flow chart for explaining the flow of the correction method.

FIG. 7 is a flow chart showing correction using the multi-deflector array and correction using pattern data.

In step S1, the static correction amount of each electron beam is measured. The stage is moved, and the position detection mark 120 on the stage is irradiated with each electron beam. Reflected electrons are measured by the reflected-electron measurement unit 117 to measure the position of each electron beam. The static correction amount of each electron beam for moving an electron beam to a position where the electron beam should be incident is determined from the position of the electron beam in a state in which the main deflector 111 is not used and the target position of the electron beam.

In step S2, the static correction amount data measured in step S1 is spooled in the CPU 308. At this time, the dynamic correction control circuit 309 and the multi-deflector array control circuit 302 are controlled to convert the data and spool it so as to be able to statically correct each electron beam.

In step S3, the dynamic correction control circuit 309 and the multi-deflector array control circuit 302 are controlled on the basis of the data spooled in the CPU 308, thereby statically correcting each electron beam. Static correction is set as an offset, and no remeasurement is done every time the wafer is exchanged. This can increase the throughput.

In step S4, the dynamic correction amount of each electron beam is measured upon deflection using the main deflector 111. Similar to measurement of the static correction amount, the stage is moved to irradiate the position detection mark 120 on the stage with each electron beam. Reflected electrons are measured by the reflected-electron measurement unit 117 to measure the position of each electron beam. The dynamic correction amount for moving each electron beam to a position after static correction is determined from the position of each electron beam upon deflection using the main deflector 111 and the position of the electron beam after static correction.

In step S5, the dynamic correction amount data measured in step S4 is added to the pattern data which is spooled in the CPU 308 and is to be drawn, thereby generating pattern data to be projected onto the substrate.

In step S6, a wafer subjected to drawing is set on the stage 119.

In step S7, the electron beam is moved to the sub-deflection region to be exposed, and drawing is prepared.

In step S8, static correction is executed by the multi-deflector arrays 105 and 106, and drawing in the sub-deflection region starts after dynamic correction using the pattern data.

In step S9, if all sub-deflection regions have not undergone drawing, the flow returns to step S7. The electron beam is moved by using the main deflector 111 to another sub-deflection region to be exposed, and drawing is done again. If all sub-deflection regions have undergone drawing, the flow advances to step S10.

In step S10, the drawn wafer is unloaded.

In step S11, whether to perform calibration is determined. The position of each beam is estimated to have changed due to a change over time and the like, and the static and dynamic correction amounts are calibrated. A predetermined time or a predetermined number of wafers is adopted as a criterion for determining whether to perform calibration. This method can maintain the drawing precision and increase the throughput of the drawing apparatus. If calibration is to be executed, the flow returns to step S1 to perform measurement again from measurement of the static correction amount. If no calibration is executed, the flow advances to step S12.

In step S12, whether all wafers subjected to drawing have been processed is determined. If a wafer subjected to drawing remains, the flow returns to step S6. If all wafers have undergone drawing, all the processes end.

[Device Manufacturing Method]

An embodiment of a device manufacturing method using the above-described electron beam exposure apparatus will be explained.

Figure 8:
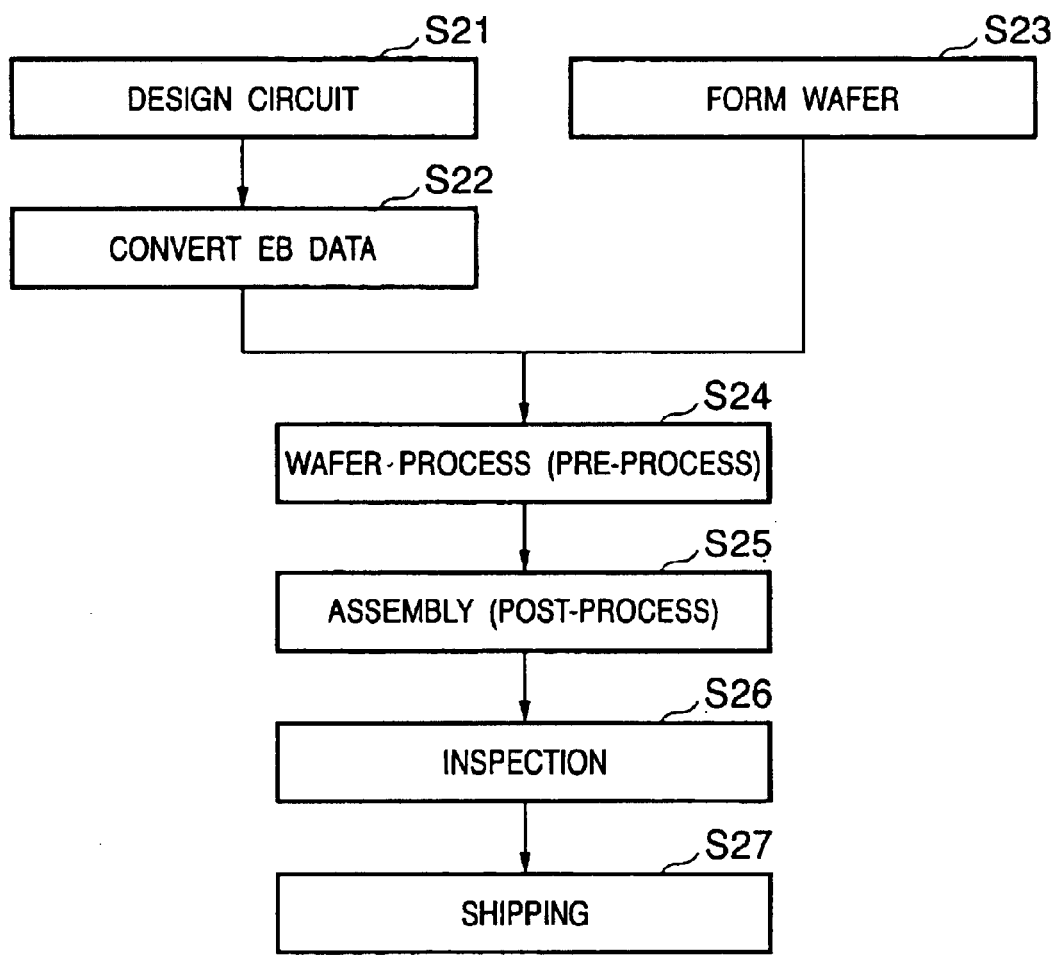
FIG. 8 is a flow chart for explaining the manufacturing flow of a microdevice.

FIG. 8 is a flow chart showing the manufacturing flow of a microdevice (semiconductor chip such as an IC or LSI, a liquid crystal panel, a CCD, a thin-film magnetic head, a micromachine, or the like). In step S21 (circuit design), the circuit of a semiconductor device is designed. In step S22 (exposure control data creation), exposure control data of the exposure apparatus is created on the basis of the designed circuit pattern. In step S23 (wafer formation), a wafer is formed using a material such as silicon. In step S24 (wafer process) called a pre-process, an actual circuit is formed on the wafer by lithography using the wafer and the exposure apparatus which has received the prepared exposure control data. Step S25 (assembly) called a post-process is the step of forming a semiconductor chip by using the wafer formed in step S24, and includes an assembly process (dicing and bonding) and packaging process (chip encapsulation). In step S26 (inspection), the semiconductor device manufactured in step S25 undergoes inspections such as an operation confirmation test and durability test. After these steps, the semiconductor device is completed and shipped (step S27).

Figure 9:
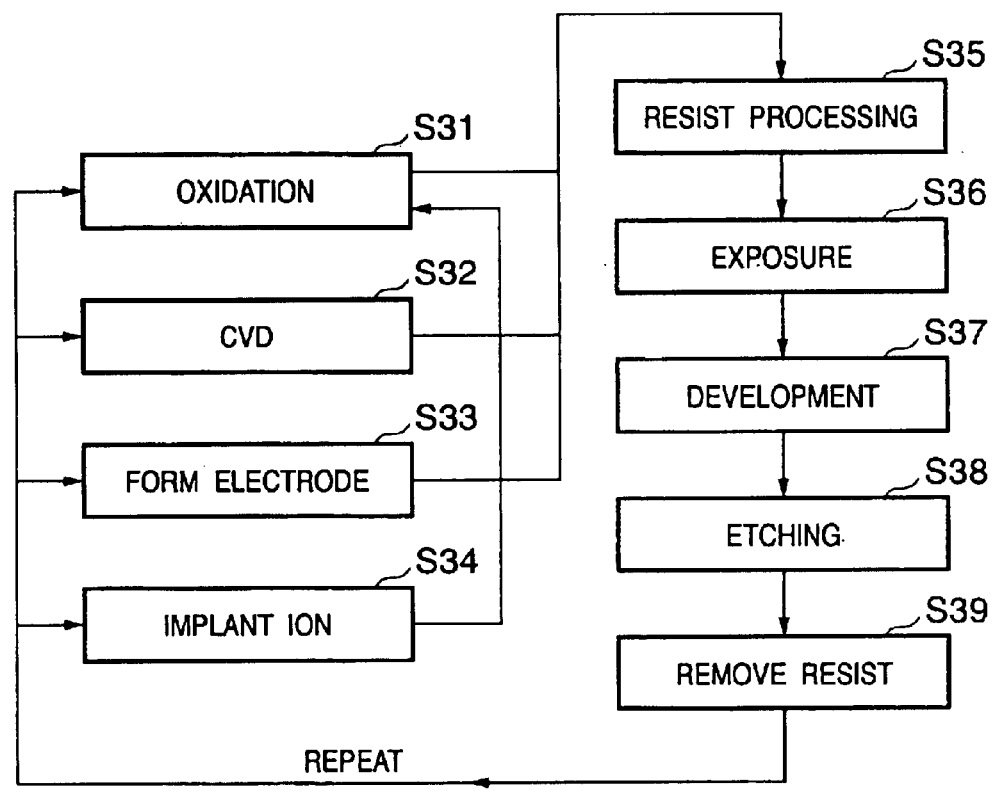
FIG. 9 is a flow chart for explaining a wafer process.

FIG. 9 shows the detailed flow of the wafer process. In step S31 (oxidation), the wafer surface is oxidized. In step S32 (CVD), an insulating film is formed on the wafer surface. In step S33 (electrode formation), an electrode is formed on the wafer by vapor deposition. In step S34 (ion implantation), ions are implanted in the wafer. In step S35 (resist processing), a photosensitive agent is applied to the wafer. In step S36 (exposure), the above-mentioned exposure apparatus projects and prints the circuit pattern on the wafer by the above-described exposure apparatus. In step S37 (developing), the exposed wafer is developed. In step S38 (etching), the resist is etched except the developed resist image. In step S39 (resist removal), an unnecessary resist after etching is removed. These steps are repeated to form multiple circuit patterns on the wafer.

The manufacturing method of the embodiment can manufacture at low cost a highly integrated semiconductor device which has been difficult to manufacture.

[Other Embodiment]

The present invention is also achieved by supplying a software program for realizing the pattern exposure flow of the above-described embodiment to a system or apparatus directly or from a remote place, and reading out and executing the supplied program codes by the computer of the system or apparatus. In this case, the software form need not be a program as far as it has a program function.

The present invention is therefore realized by program codes installed in the computer in order to realize functional processing of the present invention by the computer. That is, the claims of the present invention also include a computer program for realizing functional processing of the present invention.

In this case, the present invention can take any program form such as an object code, a program executed by an interpreter, or script data supplied to an OS as long as a program function is attained.

A recording medium for supplying the program includes a flexible disk, hard disk, optical disk, magnetooptical disk, MO, CD-ROM, CD-R, CD-RW, magnetic tape, nonvolatile memory card, ROM, and DVD (DVD-ROM and DVD-R).

As another program supply method, the program can also be supplied by connecting a client computer to an Internet homepage via the browser of the client computer, and downloading the computer program of the present invention or a compressed file containing an automatic installing function from the homepage to a recording medium such as a hard disk. The program can also be realized by grouping program codes which form the program of the present invention into a plurality of files, and downloading the files from different homepages. That is, the claims of the present invention also include a WWW server which allows a plurality of users to download the program files for realizing functional processing of the present invention by a computer.

The program of the present invention can also be encrypted, stored in a storage medium such as a CD-ROM, and distributed to the user. A user who satisfies predetermined conditions is prompted to download decryption key information from a homepage via the Internet. The user executes the encrypted program by using the key information, and installs the program in the computer.

The functions of the above-described embodiment are realized when the computer executes the readout program. Also, the functions of the above-described embodiment are realized when an OS or the like running on the computer performs part or all of actual processing on the basis of the instructions of the program.

Further, the functions of the above-described embodiment are realized when the program read out from the recording medium is written in the memory of a function expansion board inserted into the computer or the memory of a function expansion unit connected to the computer, and the CPU of the function expansion board or function expansion unit performs part or all of actual processing on the basis of the instructions of the program.

As many apparently widely different embodiments of the present invention can be made without departing from the spirit and scope thereof, it is to be understood that the invention is not limited to the specific embodiments thereof except as defined in the appended claims.

What is claimed is:

1. A multibeam exposure apparatus which exposes a substrate by using a plurality of charged-particle beams, comprising:
    a deflection member which deflects an incident position of each of the plurality of charged-particle beams on the substrate;
    a generation member which generates pattern data to be projected onto the substrate; and
    a correction member which corrects a positional error of each of the plurality of charged-particle beams by said deflection member and said generation member.

2. The apparatus according to claim 1, wherein when each of the plurality of charged-particle beams is deflected to a predetermined exposure position on the basis of the pattern data, said correction member corrects a static positional error independent of a deflection position by said deflection member, and corrects a dynamic positional error dependent on the deflection position by said generation member.

3. A multibeam exposure method of exposing a substrate by deflecting each of a plurality of charged-particle beams to a predetermined exposure position, comprising:
    a first correction step of correcting a positional error of each of the plurality of charged-particle beams by independently deflecting a position of each of the plurality of charged-particle beams; and
    a second correction step of correcting the positional error of each of the plurality of charged-particle beams by generating pattern data to be projected onto the substrate.

4. The method according to claim 3, wherein in the first correction step, a static positional error independent of a deflection position is corrected when each of the plurality of charged-particle beams is deflected to a predetermined exposure position on the basis of the pattern data, and in the second correction step, a dynamic positional error depending on the deflection position is corrected.

5. A method of manufacturing a device by using an exposure method defined in claim 3.

6. An exposure apparatus which exposes a substrate by using a plurality of charged-particle beams on the basis of pattern data, comprising:
    a deflector array which deflects an incident position of each of the plurality of charged-particle beams on the substrate so as to correct a first component out of the positional error of each of the plurality of charged-particle beams; and
    a controller which generates the pattern data so as to correct a second component out of the positional error of each of the plurality of charged-particle beams.

7. The apparatus according to claim 6, further comprising a main deflector which deflects the plurality of charged-particle beams at once,
    wherein the first component contains a static distortion independent of deflection by said main deflector, and the second component contains a dynamic distortion dependent on the deflection by said main deflector.

8. A device manufacturing method comprising steps of:
    exposing a substrate by using an exposure apparatus defined in claim 6; and
    developing the exposed substrate.

* * * * *